(12) United States Patent
Siddiqi et al.

(10) Patent No.: US 9,558,313 B1
(45) Date of Patent: Jan. 31, 2017

(54) METHOD AND SYSTEM FOR PROVIDING A GAME THEORY BASED GLOBAL ROUTING

(71) Applicant: KING FAHD UNIVERSITY OF PETROLEUM AND MINERALS, Dhahran (SA)

(72) Inventors: Umair Farooq Siddiqi, Dhahran (SA); Sadiq M. Sait, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 14/847,750

(22) Filed: Sep. 8, 2015

(51) Int. Cl.
  *G06F 17/50* (2006.01)
(52) U.S. Cl.
  CPC .................. *G06F 17/5077* (2013.01)
(58) Field of Classification Search
  CPC  G06F 17/5077; G06F 17/5018; G06F 17/505;
  G06F 17/5072
  See application file for complete search history.

(56) References Cited

U.S. PATENT DOCUMENTS

| | | | |
|---|---|---|---|
| 2004/0098697 A1* | 5/2004 | Frankle | G06F 17/5077 716/129 |
| 2005/0138578 A1* | 6/2005 | Alpert | G06F 17/5077 716/114 |
| 2006/0288323 A1* | 12/2006 | Birch | G06F 17/5077 716/129 |
| 2007/0220522 A1 | 9/2007 | Coene et al. | |
| 2008/0170514 A1 | 7/2008 | Hentschke et al. | |
| 2009/0031275 A1* | 1/2009 | Cho | G06F 17/5077 716/129 |
| 2009/0144688 A1* | 6/2009 | Uchino | G06F 17/5077 716/126 |
| 2011/0055790 A1* | 3/2011 | Gao | G06F 17/5077 716/130 |
| 2013/0031524 A1 | 1/2013 | He et al. | |
| 2014/0157221 A1* | 6/2014 | Peyer | G06F 17/5077 716/129 |
| 2014/0215426 A1* | 7/2014 | He | G06F 17/5077 716/129 |

OTHER PUBLICATIONS

John A. Nestor, "A New Look at Hardware Maze Routing" http://www.researchgate.net/profile/John_Nestor/publication/2871183_A_New_Look_at_Hardware_Maze_Routing/links/00b7d53505831cb248000000.pdf, 2000, 6 pages.
Kei Suzuki, et al., "A Hardware Maze Router with Application to Interactive Rip-Up and Reroute", IEEE Transactions on Computer-Aided Design, vol. CAD-5, No. 4, Oct. 1986, pp. 466-476.

* cited by examiner

*Primary Examiner* — Nha Nguyen
(74) *Attorney, Agent, or Firm* — Oblon, McClelland, Maier & Neustadt, L.L.P.

(57) ABSTRACT

A system and method for global routing that includes receiving nets that need to be routed and capacity constraints, ordering, using processing circuitry, the nets, routing, using the processing circuitry, the nets based on a maze routing with framing method, determining, using the processing circuitry, whether the routing is congestion free, selecting, using the processing circuitry, a subset of the nets based on a game theory method when the routing is not congestion free, applying a rip-up and re-route process on the subset of the nets, and repeating the selecting and applying steps until the routing is congestion free.

16 Claims, 14 Drawing Sheets

Input: $T$: Spanning trees of all nets, $N$: set of all nets, Parameters: $CT1 \in Z, TP \in \{True, False\}$

Output: $PR = \{PR_0, PR_1, ..., PR_{N-1}\}$: mixed strategies of all nets

1: for each net $n_i \in N$ do
2:     $ofl(n_i) = \sum_{e_i \in t_i} overflow(e_i)$
3:     $fl(n_i) = \sum_{e_i \in t_i} full(e_i)$
4:     $area(n_i)$ = area bounded by the pins ($p_i$) of $n_i$.
5:     $Iter(n_i)$ = Number of iterations since $n_i$ was ripped-up and re-routed last time.
6: endfor
7: if $\sum_{n_i \in N} ofl(n_i) > 0$ then
8:     Normalize values in $ofl$, $fl$ and $Iter$.
9:     for each net $n_i \in N$ do
10:       $p_Y(i) = \begin{cases} \frac{1}{area(n_i)} & \text{if } TP = 0, ofl(n_i) > 0, \\ \frac{CT1 \times ofl(n_i) + fl(n_i)}{m} \times (1 + Iter(n_i)) & \text{if } TP = 1, \\ 0 & \text{otherwise} \end{cases}$
11:     endfor
12:     Normalize $p_Y$ values
13: else
14:     for $i=0$ to $N-1$ do
15:       $p_Y(i) = 0$
16:     endfor
17: endif
18: for $i=0$ to $N-1$ do
19:     $PR_i = \{p_Y(i), 1 - p_Y(i)\}$
20: endfor
21: return $(PR)$

*FIG. 8*

Input: $G(V, E)$, $t_i$, $t_i^*$: two spanning trees for a net $n_i$, $NEG \in Z^+$
Output: $Y \in true, false$
1: $Y = false$
2: $A = \sum_{e_x \in t_i} overflow(e_x)$
3: $B = \sum_{e_x \in t_i} full(e_x)$
4: $C = |t_i|$
5: $D = \sum_{e_x \in t_i^*} overflow(e_x)$
6: $E = \sum_{e_x \in t_i^*} full(e_x)$
7: $F = |t_i^*|$
8: $r_{NEG}=$ a random integer between $-NEG$ and $0$
9: if $D < A$ or $(D - A) \leq r_{NEG}$ then
10:     $Y = true$
11: else
12:     if $D == A$ and $E < B$ then
13:         $Y = true$
14:     else
15:         if $D == A$ and $B == E$ and $F < C$ then
16:             $Y = true$
17:         endif
18:     endif
19: endif
20: return $Y$

*FIG. 10*

Input: $i$: current iteration, Overflow values of last $CT2$ iterations: $\{tof(T_i), tof(T_{i-1}), ..., tof(T_{i-CT2})\}$ 1: if i=0 then
2:    $RR1 = RR1_i, CT1 = CT1_i, BOX\_SIZE = BOX\_SIZE_i, \beta = \beta_i$
3:    $TP1 = 0$
4: else
5:    $RR1 = RR1 + RR1_d$
6:    if $RR1 > RR1_f$ then
7:      $RR1 = RR1_i$
8:    endif
9:    if $tof(T_i) = tof(T_{i-1})$ then
10:      $CT1 = CT1 + CT1_d$
11:      $TP1 = 1$
12:    endif
13:    if $CT1 > CT1_f$ then
14:      $CT1 = CT1_i$
15:    endif
16:    if $tof(T_i) < T_m$ then
17:      $BOX\_SIZE = BOX\_SIZE_f$
18:    else
19:      if $tof(T_i) = tof(T_{i-1}) = ... = tof(T_{i-CT2})$ then
20:        $BOX\_SIZE = BOX\_SIZE + BOX\_SIZE_d$
21:        if $BOX\_SIZE > BOX\_SIZE_f$ then
22:          $BOX\_SIZE = BOX\_SIZE_f$
23:        endif
24:        $\beta = \beta + \beta_d$
25:        if $\beta > \beta_f$ then
26:          $\beta = \beta_i$
27:        endif
28:      endif
29:    endif
30: endif

*FIG. 11*

METHOD AND SYSTEM FOR PROVIDING A GAME THEORY BASED GLOBAL ROUTING

BACKGROUND

1. Technical Field

The present invention relates to global routing in printed circuit board (PCB) routing and in physical design of integrated VLSI circuits.

2. Description of Related Art

Global routing is a critical step in the physical design of integrated circuits and is a NP-hard (Non-deterministic Polynomial-time hard) problem as described in T. Langauer, Combinational algorithms for integrated circuit and layout, John Wiley & Sons, New York, 1990. Global routing lies between placement and detailed-routing steps in the physical design of VLSI (Very Large Scale Integration) chips. In global routing, nets of wires are mapped to a coarse grid of global routing cells (or gcells). Each gcell has a fixed horizontal and vertical capacity. The objective of global routing is to assign the nets while satisfying capacity constraints (horizontal and vertical) of the gcells as described in H. Y. Chen and Y. W. Chang, Electronic Design Automation: Synthesis, Verification, and Testing, Elsevier Morgan Kaufmann, pp. 687-749 (2009). Each net is routed by generating a spanning tree for it that covers all of its pins. A solution of the global routing problem that does not violate the capacity constraints of the gcells is a valid solution. Routability-driven (RD) placement is a recent development that uses global routing to guide the placement process. The RD placement is described in X. He. T. Huang, L. Xiao, H. Tian, and E. F. Y. Yong, Ripple: A robust and effective routabiltiy-driven placer, IEEE Trans. Computer Aided Design of Integrated Circuits and Systems, 32, (10), pp. 1546-1556, (2013) and M. Pan, and C. Chu, FastRoute: A Step to Integrate Global Routing into Placement, IEEE/ACM International Conference on Computer-Aided design, San Jose, Calif., November 2006, pp. 464-471. The RD placement process needs to execute global routing several times. Therefore, global routers should have good solution quality and runtime.

Among the methods of routing, maze routing is the only method that guarantees to find a path between any two pins if there exists one. Therefore, many global routers use maze routing exclusively, or use other methods for initial routing and use maze routing for difficult-to-route nets as described in K. Suzuki, Y. Matsunaga, M. Tachibana, and T. Ohtsuki, A hardware maze router with application to interactive rip-up and reroute, IEEE Trans. Computer-Aided Design, CAD, 5(4), 155-157 and M. Pan, U. Xu, X. Zhang, and C. Chu, FastRoute: An efficient and high-quality global router, VLSI design, Hindawi Publishing Corporation, (2012). However, maze routing is slow and memory intensive. Maze routing is generally used with a rip-up and re-route (R&R) process to produce valid solutions. The main task of the R&R process is to selectively rip-up and re-route a small fraction of nets in order to eliminate congestion. Maze routing with framing (MRF) is a modification of maze routing in which a net determines its spanning tree within a bounding box of the grid. The MRF method is described in S. Sait and H. Youssef, VLSI Physical Design and Automation: Theory and Practice, World Scientific Publishers, 243-244, 1999. The MRF method is very fast as compared to traditional maze routing and the size of the bounding box can be increased or decreased. Lee algorithm is a popular method of maze routing and has a breath-first behavior. Recent research showed that Lee algorithm is highly suitable for implementation using parallel computing platforms such as graphics processor units (GPUs) because of its simple data-structure and breath-first behavior which can be easily implemented on parallel platforms. Lee algorithm is described in in S. Sait and H. Youssef, VLSI Physical Design and Automation: Theory and Practice, World Scientific Publishers, 239-241, 1999.

GT based algorithms have been used in routing of communication networks, multi-agent optimization problem and wireless networking as described in F. N. Pavlidou and G. Koltisdas, Game theory for routing modeling in communication networks, A survey, Journal of Communications and Networks, 10 (3) (2008), 268-286, A. Salhi and O. Toreyen, Computational Intelligence in Optimization, Springer-Verlag Berlin, Heidelberg, (2010), pp. 211-232, and L. A. DaSilva, H. Bogucka and A. MacKenzie, Game theory in wireless networks, IEEE Communications Magazine, 49 (8), (2011), 110-111.

The good performance of GT in solving congestion problems in computers and communication networks motivates its use in solving the global routing problem of VLSI physical design.

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention. The foregoing paragraphs have been provided by way of general introduction, and are not intended to limit the scope of the following claims. The described embodiments, together with further advantages, will be best understood by reference to the following detailed description taken in conjunction with the accompanying drawings.

SUMMARY

The present disclosure relates to a global routing method that receives nets that need to be routed and capacity constraints, orders, using processing circuitry, the nets, routes, using the processing circuitry, the nets based on a maze routing with framing method, determines, using the processing circuitry, whether the routing is congestion free, selects, using the processing circuitry, a subset of the nets based on a game theory method when the routing is not congestion free, applies, using the processing circuitry, a rip-up and re-route process on the subset of the nets, and repeats the selecting and applying steps until the routing is congestion free.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 8 is an outline of an algorithm for determining mixed strategies of the nets according to one example;

FIG. 10 is an outline of a function for comparing two trees according to one example;

FIG. 11 is an outline of an algorithm for updating the parameter values;

DETAILED DESCRIPTION

Figure 1:
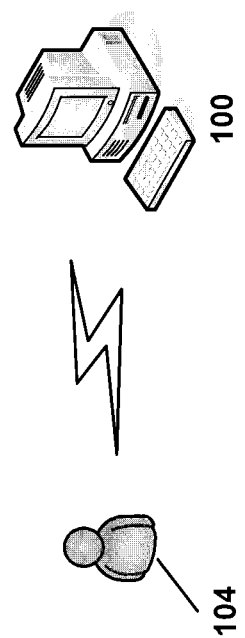
FIG. 1 is a schematic representation of a global routing system according to one example.

Referring now to the drawings, wherein like reference numerals designate identical or corresponding parts throughout several views, the following description relates to an apparatus and associated methodology for global routing based on game theory.

The method described herein provides a global router that uses maze routing with framing (MRF) method. The method also contains a rip-up and re-route (R&R) process whose role is to eliminate congestion. The R&R is modeled using game theory (GT). In the game theory model, nets (also called "interconnections") act as players that want to optimize their spanning trees in terms of congestion and wirelength. GT is a useful technique of decision making and multi-agent optimization.

Figure 12:
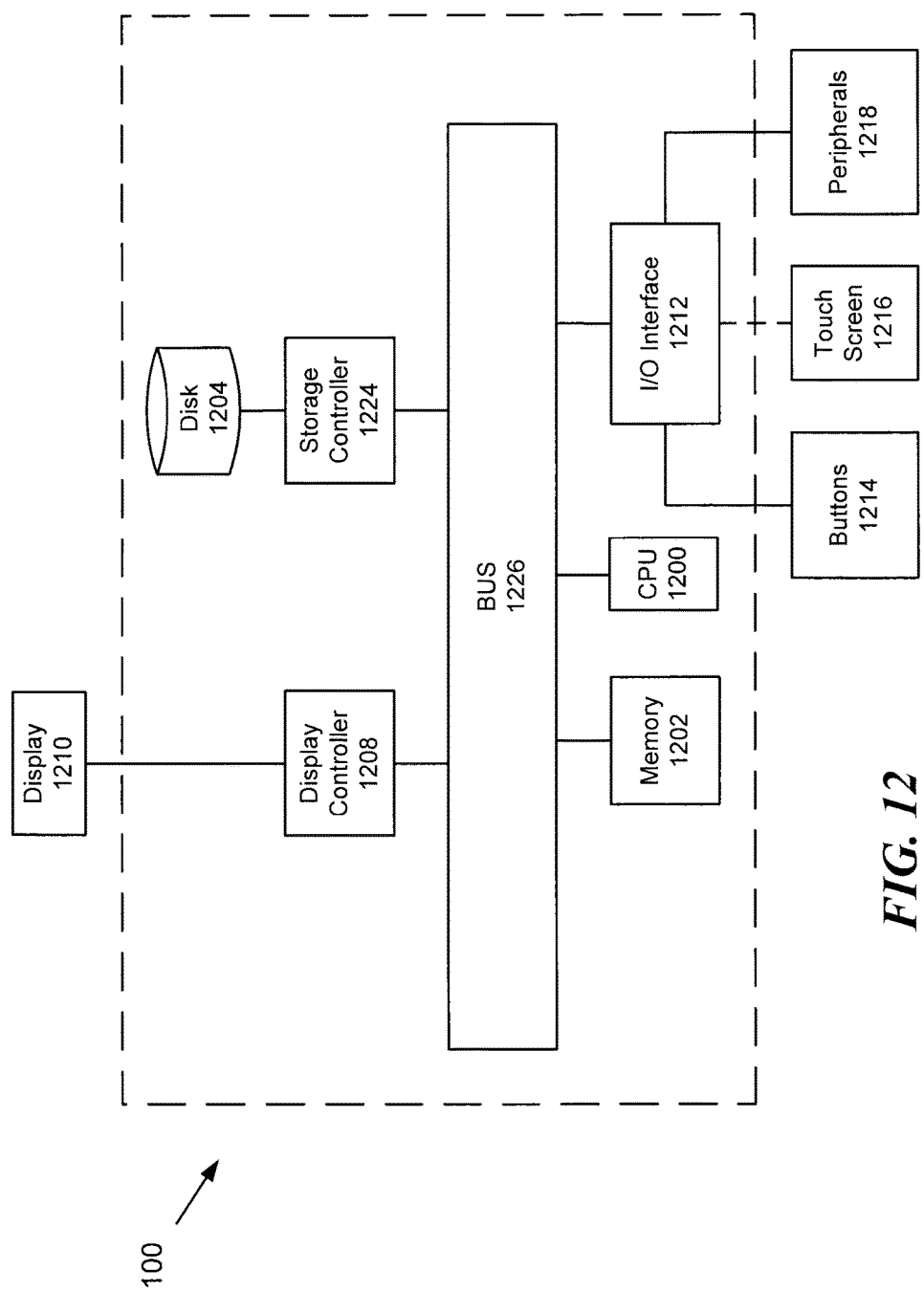
FIG. 12 is an exemplary block diagram of a computer according to one example.

FIG. 1 is a schematic representation of a global routing system. A user 104 may connect to a computer 100 to perform global routing. The user 104 may use the graphical user interface to input data and constraints for the global routing problem. The computer 100 includes a CPU 1200 and a memory 1202 as shown in FIG. 12. The computer 100 may also receive data from host applications. The user 104 may use a flash drive to load data to the computer 100.

Figure 2:
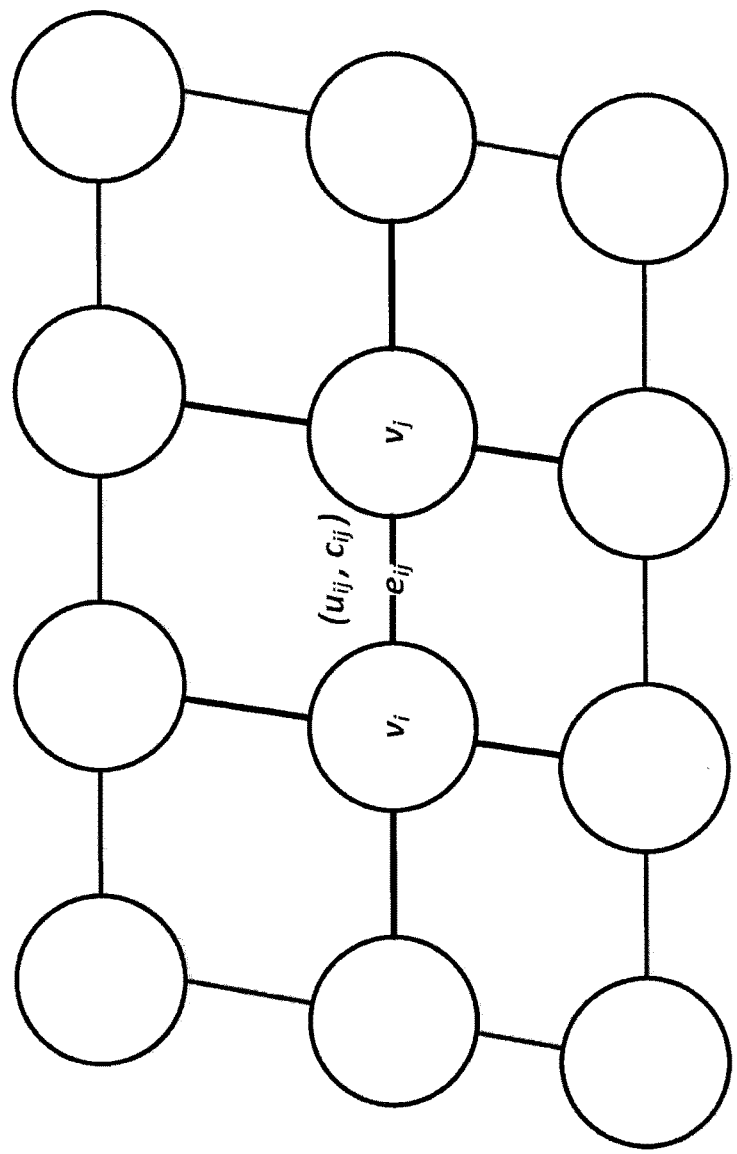
FIG. 2 is a grid graph of the 2D global routing according to one example.

In one embodiment, the global routing problem is modeled using a 2D grid-graph G. The 2D grid-graph has a set of vertices V and a set of edges E. Each vertex $v_i \in V$ corresponds to a gcell, and each edge $e_{ij} \in E$ corresponds to a boundary between adjacent vertices $v_i$ and $v_j$. Each edge $e_{ij}$ has a capacity $c_{ij}$ which is the maximum number of nets or wires that can pass through it. The actual number of nets that are passing through an edge $e_{ij}$ is called its demand and is represented as $u_{ij}$. FIG. 2 shows the grid graph according to an example. The problem also contains a set of nets N, where each net $n_i \in N$ is composed of a set $P_i$ of pins (with each pin corresponding to a vertex $v_i$). Each net $n_i \in N$ is routed by finding a tree $t_i$ that covers all its pins. Each tree $t_i \in E$ a set of edges without any cycles or repetition of edges $t_i \subseteq E$. The set T stores the spanning trees of all nets.

The objective of global routing is to route all the nets and to make sure that capacity constraints of the edges are not violated, i.e. $u_{ij} \le c_{ij}$, $\forall e_{ij} \in E$. The edge $e_{ij}$ is congested or have an overflow when $u_{ij} > c_{ij}$. The CPU 1200 may compare the demand of the edge and the capacity of the edge to determine whether the edge is overflowed. The edges whose demand is equal to their capacity are fully utilized. The fully utilized and congested edges are considered important in eliminating congestion. The congested edges contribute directly to the total overflow. The fully utilized edges although do not contribute directly to the congestion, but they can contribute to blocking routing of other nets. The amount of overflow associated with the edge $e_{ij}$, i.e. overflow ($e_{ij}$) can be expressed as:

$$\text{overflow}(e_{ij}) = \begin{cases} u_{ij} - c_{ij} & \text{if } u_{ij} > c_{ij} \\ 0 & \text{otherwise} \end{cases} \quad (1)$$

To determine whether the edge is fully utilized, i.e., full ($e_{ij}$) can be expressed using the following equation:

$$\text{full}(e_{ij}) = \begin{cases} 1 & \text{if } u_{ij} = c_{ij} \\ 0 & \text{otherwise} \end{cases} \quad (2)$$

In one embodiment, the overflow and full of each edge may be stored in the memory 1202.

The total overflow (tof) is equal to the total overflow of all edges and can be calculated by the CPU 1200 using:

$$tof(T) = \sum_{e_{ij} \in E} \text{overflow}(e_{ij}) \quad (3)$$

The global router described herein executes three main tasks: (a) ordering of nets, (b) initial routing of nets, and (c) R&R process to eliminate congestion from the solution of initial routing.

Figure 3:
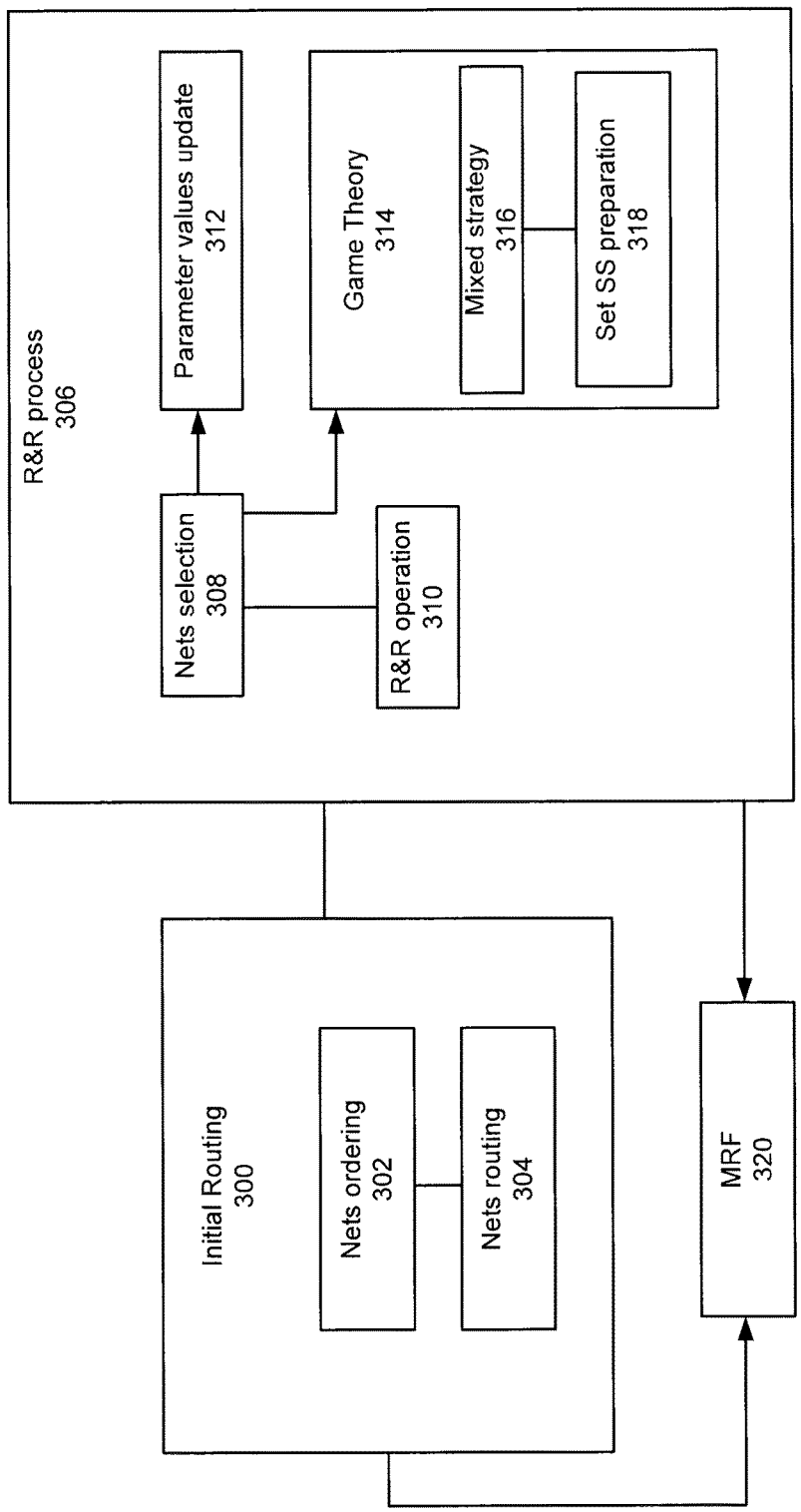
FIG. 3 is a block diagram representation of a global router according to one example.

FIG. 3 is a block diagram representation of the global router according to one example. The tasks are distributed among several components or modules. Each of the modules described herein may be implemented in circuitry that is programmable (e.g. microprocessor-based circuits) or dedicated circuits such as application specific integrated circuits (ASICS) or field programmable gate arrays (FPGAS). The global router has three main modules: (i) initial routing module 300, (ii) MRF module 320, and (iii) R&R process module 306. These modules work together to accomplish global routing. The initial routing module 300 includes a nets ordering module 302 and a nets routing module 304. The nets ordering module 302 and the nets routing module 304 executes the tasks of ordering and routing the nets respectively. The initial routing module 300 uses the MRF module 320 to route the nets using the MRF method. The R&R process module includes a nets selection module 308, a game theory module 314, a R&R operation module 310, and a parameter values update 312.

The nets selection module 308 uses the game theory module 314 to determine the nets. The game theory module 314 applies a GT based heuristic to determine the nets that should be ripped-up and re-routed in-order to reduce the congestion of the solution. The nets selected for the R&R operation are the set SS. The R&R operation module 310 obtains the set SS from the nets selection module 308. The parameter values update module 312 performs self-adjustment of parameters values based on the feedback of previous iterations in-order to reduce the convergence time of the R&R process. In one embodiment, the adjustment of the parameters values may be based on past routing data stored in the memory 1202. The game theory module 314 may include a mixed strategy module 316 and a set SS preparation module 318.

Figure 4:
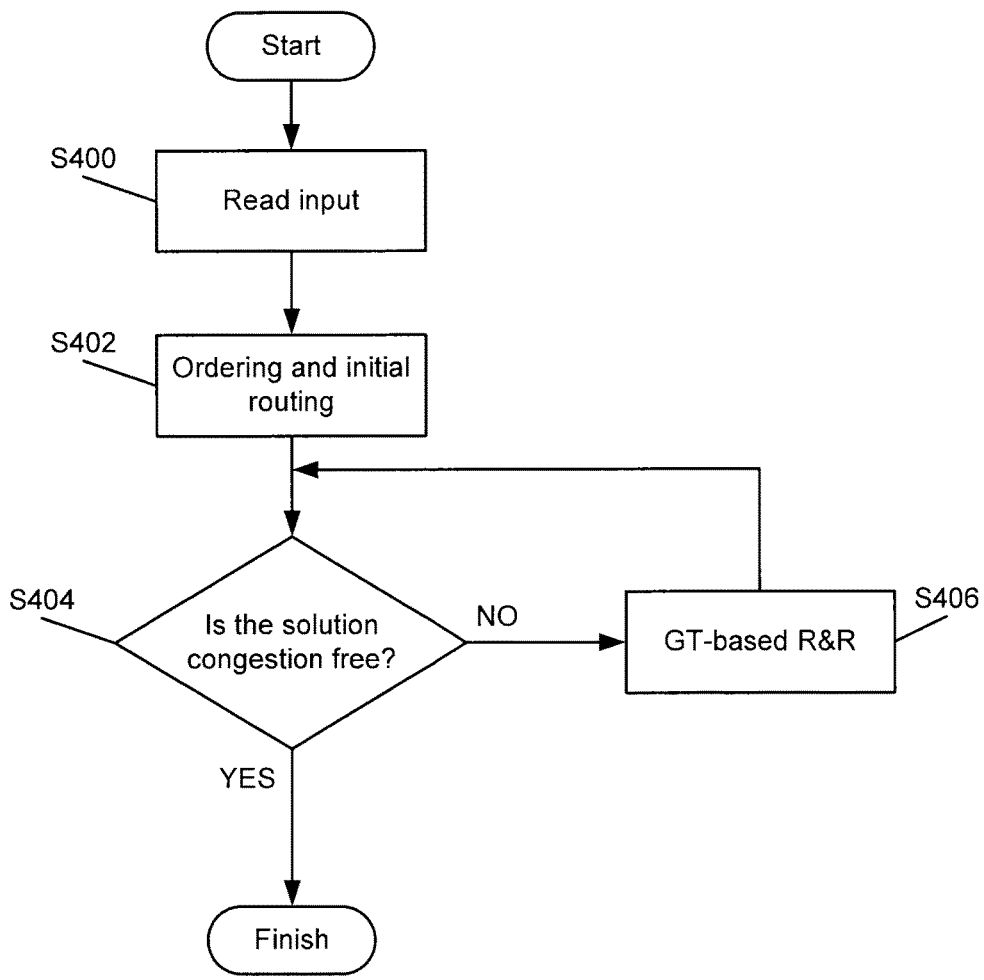
FIG. 4 is a flow chart showing the operation of the global router according to one example.

FIG. 4 is a flow chart showing the operation of a global router. At step S400, the CPU 1200 loads the 2D grid graph (G(V,E)), set of all nets (N) and a plurality of parameters. The 2D grid graph, the set of all nets, and the plurality of parameters may be obtained from the user 104. In one embodiment, the 2D grid graph, the set of all nets, and the plurality of parameters may be obtained from other applications such as a VLSI design application. A first parameter NUM_THREADS sets the number of concurrent threads in the initial routing of nets. At step S402, the CPU 1200 sorts the nets and performs an initial routing of the nets. The nets are sorted in ascending order of the area bounded by their pins. In this ordering, the nets whose pins are closer to each other are routed first. The rationale behind this ordering is that the nets whose pins are far from each other usually have more number of possible trees (i.e. alternate choices) available to them as compared to the nets whose pins are closer to each other. The nets that have more alternate choices available are less likely to be blocked from the routing of the other nets. The routing of nets can be done sequentially or concurrently. In one embodiment, the CPU 1200 may be a multicore processor and multi-threading (MT) is possible. The routing of nets can be parallelized by using the following steps: (i) dividing the sorted nets in N among $\{N_0, N_1, \square, N_{NUM\_THREADS-1}\}$ subsets, (ii) creating concurrent threads $tr_0, tr_1, \square, tr_{NUM\_THREADS-1}$ such that $tr_i$ routes the nets in $N_i$ (where i=0 to NUM_THREADS), and (iii) executing the threads in parallel. The threads update the demand information of the edges after routing each net. The parallelization causes some increase in the congestion of the initial routing phase but that can be compensated in the GT-based R&R process. The CPU 1200 routes a net by using the MRF method of routing. After the completion of the initial routing phase, the flow goes to step S404. At step S404, the CPU 1200 may check whether the solution is congestion free. In response to determining that the solution is congestion free, the process ends. In response to determining that the solution is not congestion free, the flow goes to step S406. At step S406, the GT based R&R process is executed. Step S406 is repeated until the solution is congestion free. In one embodiment, the CPU 1200 may check whether the solution is congestion free by determining the total overflow by applying equation (3). When the total overflow is equal to zero, the CPU 1200 determines that the solution is congestion free.

Figure 5:
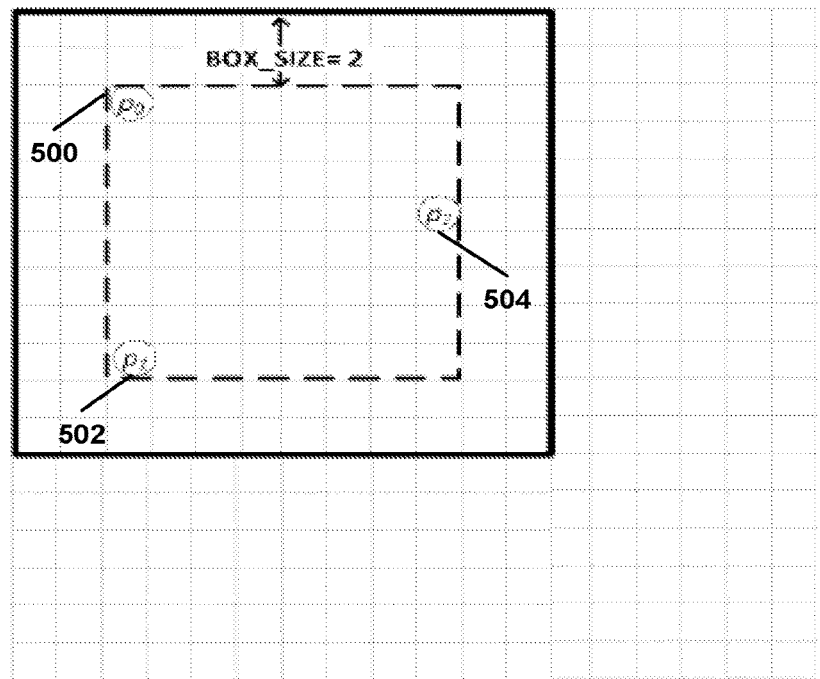
FIG. 5 is a schematic that shows an exemplary bounding region of the Maze routing with framing (MRF) method for a net according to one example.

FIG. 5 is a schematic that shows an exemplary bounding region of the MRF method for a net according to one example. FIG. 5 shows a bounding region of a net which has three pins ($p_0, p_1, p_2$) 500,502,504 respectively. The size of the bounding box can be increased or decreased using a second parameter BOX_SIZE. The routing region of each net is restricted to a rectangular region that covers its pins and some surrounding cells.

Figure 6:
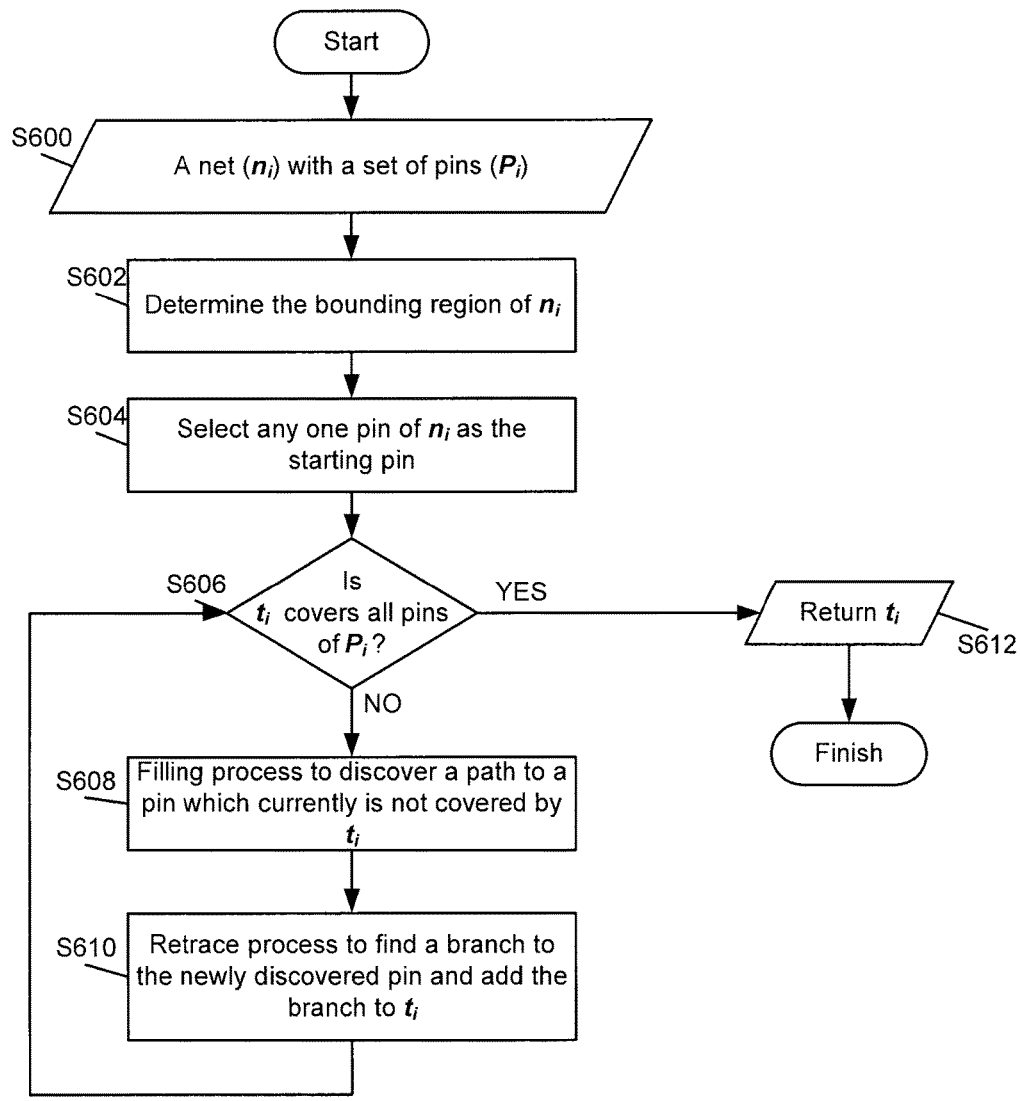
FIG. 6 is a flow chart which shows the routing of the net using the MRF method according to one example.

FIG. 6 shows the main steps in routing a net using the MRF method according to an example. The variable $t_i$ stores the spanning tree of net $n_i$. At step S600, the CPU 1200 loads the input which is a net and its set of pins. The spanning tree of $n_i$ is represented as $t_i$. This method generates a complete spanning tree of $n_i$. At step S602, the CPU 1200 finds a bounding box using all pins of $n_i$. At step S604, the CPU 1200 randomly selects any pin as the starting vertex of the spanning tree. At step S606, the CPU 1200 checks whether the spanning tree covers all pins of the net. In response to determining that the spanning tree does cover all pins of the net, the CPU 1200 outputs $t_i$ at step S612. In response to determining that the spanning tree does not cover all pins of the net, the flow goes to step S608. At step S608, the CPU 1200 performs a filling process to discover a path to a pin which is currently not covered by $t_i$. At steps S608 and S610, the filling and retracing processes use the Lee's algorithm on a weighted grid. The weights of all vertices in $t_i$ are set to zero. The weights of the remaining cells in the bounding box can be obtained as follows. For any cell $v_j \in V$ whose preceding cell in the filling process is $v_i$ and the edge between them is represented as $e_{ij}$. The cost of $v_j$ can be calculated as follows:

$$\text{cost}(v_j) = 1 + e^{u_{ij}-(c_{ij}-\beta)} + \text{cost}(v_i) \qquad (4)$$

where $u_{ij}$ and $c_{ij}$ represent the demand and capacity of the edge $e_{ij}$ and the purpose of the exponential term is to avoid selection of paths through congested edges. When $(u_{ij}-(c_{ij}-\beta))<0$, the role of congestion is very limited and the CPU 1200 finds minimum length paths. However, when $(u_{ij}-(c_{ij}-\beta))>0$, then the role of congestion costs becomes significant and the paths are determined with respect to minimum length as well as minimum congestion. The value of the second parameter $\beta$ is initially set by the user 104 but can be varied in the R&R process in order to build spanning trees that have minimum length and/or minimum congestion. The filing process terminates when the CPU 1200 determines that at least one of the following conditions is satisfied: (a) the weights are assigned to all cells in the bounding box, or (b) a pin of the net which is not yet selected in $t_i$ is found. At step S610, the CPU 1200 executes the retracing process and forms a branch to a currently uncovered pin of the net from any one node (or cell) of $t_i$.

GT is used to solve the problem of deciding which nets are selected to be ripped-up and re-routed in order to eliminate congestion. The selection of nets in the R&R process is modeled as a game in which nets act as players. The set N becomes the set of players of the game. Each net $n_i \in N$ has two pure strategies $S_i = \{Yes, No\}$. The strategy Yes means that $n_i$ attempts to improve its spanning tree and strategy No means that $n_i$ should not attempt to improve its spanning tree. The players use mixed strategies to select their pure strategies. The mixed strategy of each player $n_i \in N$ is represented as $PR_i = (p_Y, 1-p_Y)$, where $p_Y$ is the probability of selecting the strategy Yes and $1-p_Y$ is the probability of selecting the strategy No. The Nash equilibrium (NE) of the game is reached when the total overflow of the solution becomes zero and at that point all nets want to stick to their No strategy ($p_Y$ becomes zero for all nets). The aim of the GT based method described herein is to eliminate congestion, however it has other advantages. The Nash equilibrium is described in E. N. Barron, Game Theory: An introduction, $2^{nd}$ Edition, John Wiley & sons, 2013 and N. Nisan, T. Roughgarden, E. Tardos, V. Vazirani, Algorithmic Game Theory, Cambridge University Press, 2007.

Each player wants to achieve two goals: (i) its spanning tree becomes congestion free, and (ii) its spanning tree should not be blocking the routing of any other net. In any iteration, the nets which are more likely to progress towards achieving their goals have higher values of mixed strategies and hence, are more likely to go through the R&R operation.

Figure 7:
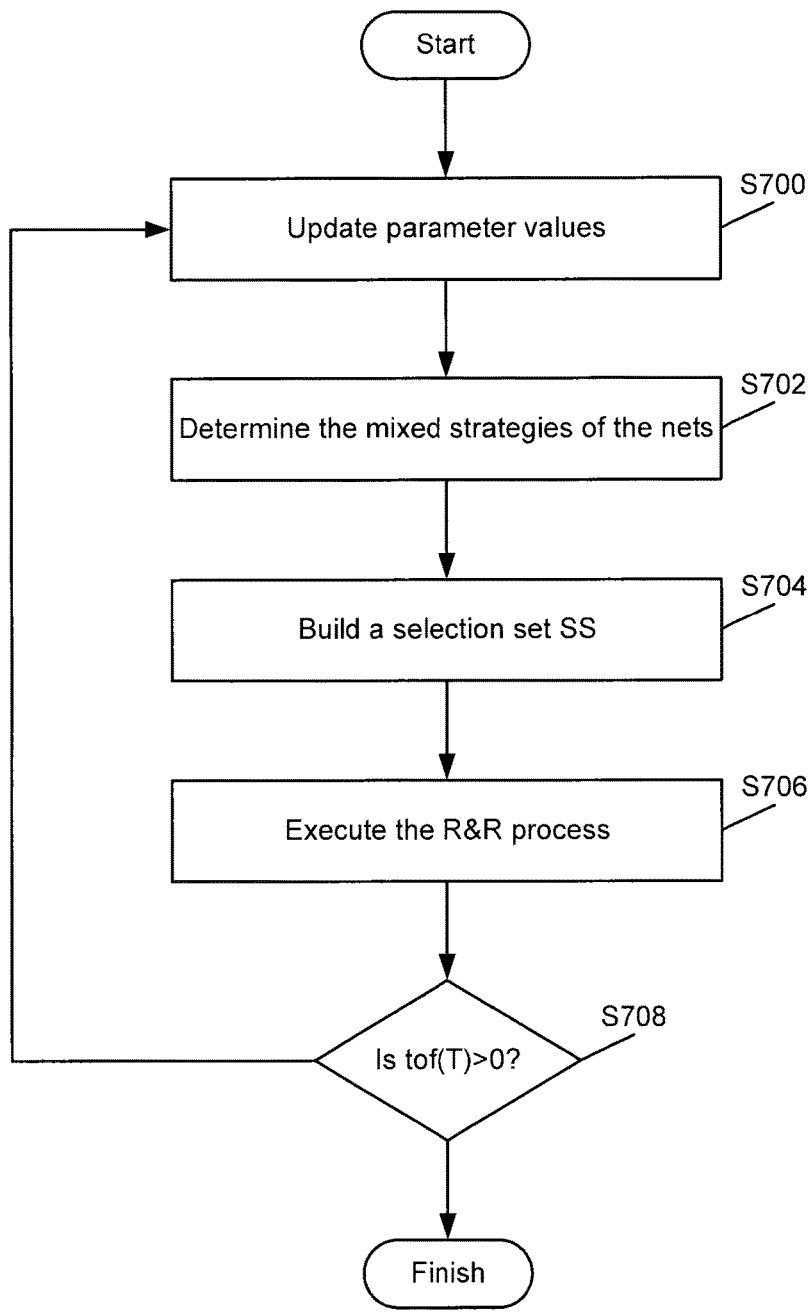
FIG. 7 is a flow chart that shows the Game theory (GT)-based rip-up and re-route (R&R) process according to one example.

FIG. 7 is a flow chart that shows the GT-based R&R. The R&R component executes the R&R process to eliminate congestion from the solution of initial routing. At step S700, the CPU 1200 updates the parameter values. In one embodiment, the parameter values are updated using the parameter value update module 312. At step S702, the CPU 1200 determines the mixed strategies of the nets. In one embodiment, the CPU 1200 may execute the algorithm shown and described in FIG. 8. At step S704, a selection set is determined using the set SS preparation module 318. At Step S706, the R&R process is executed using the R&R operation module 310. At step S708, the CPU 1200 calculates the total overflow. The CPU 1200 may apply equation (3) to determine the total overflow. Then, the CPU 1200 checks whether the total overflow is greater than zero. In response to determining that the total overflow is greater than zero, the flow goes to step S700. In response to determining that the total overflow is less than zero, the process ends.

FIG. 8 is an outline of an algorithm for determining mixed strategies of the nets according to one example. The input contains two parameters (third parameter and fourth parameter): CT1 and TP. The third parameter CT1 acts as the weight of the term related to the overflow of the spanning trees and the fourth parameter TP is used to select a method to calculate the value of $p_Y$. A first method assigns higher values to the nets whose pins enclose a smaller area as compared to the other nets and $p_Y$ of the nets, which have no overflow, is zero. The benefit of the first method is that the nets that have congestion as well as require less time in re-routing are preferred for the R&R operation as compared to others. The second method assigns values based on the following: (i) the nets that have more overflow and fully used edges have a higher $p_Y$ value, (ii) the weight of the overflow value in $p_Y$ can be changed using the third parameter CT1, and (iii) the nets that have not been ripped-up and re-routed since many iterations have larger $p_Y$ values. The $p_Y$ values of the nets that have neither congested edges nor fully used edges is zero. The pseudo-code in FIG. 8 also shows that if none of the nets has any overflow then $p_Y$ values of all nets becomes zero. When the value of the third parameter CT1>>1, then the $p_Y$ values rely more on the overflow of the edges as compared to other factors. When CT1≈1, then $p_Y$ values rely equally on overflow and number of fully used edges. When CT1<<1, then $p_Y$ values rely more on the number of fully used edges. Next, the CPU 1200 prepares a set SS that contains the nets whose spanning tree should be rip-up and re-routed. In the selection of nets in SS, the $p_Y$ values of nets act as their probabilities to be selected to the SS by the CPU 1200.

The input of the R&R operation module 310 is the set SS. Two types of R&R operations may be used: (i) R&R Type A, and (ii) R&R Type B. The Type A operation rips-up and re-routes one net at time, whereas, the Type B operation first rips-up two nets and then re-routes them. In both type of operations, the nets are ripped-up and re-routed completely. The R&R process is executed sequentially. The nets in SS are divided into two subsets $SS_A$ and $SS_B$ such that $SS_B$ contains RR1% nets of SS and $SS_A$=SS–$SS_B$. Furthermore, the number of nets in $SS_B$ should be even. The CPU 1200 may check whether the number of nets in $SS_B$ is even. In response to determining that the number of nets in $SS_B$ is not even, one element is moved from $SS_B$ to $SS_A$. The nets in $SS_A$ go through the type A operation and the nets in $SS_B$ go through the Type B operation. The global router described herein uses two types of R&R operations to reduce the convergence time based on the experiments conducted.

The R&R process is executed as follows: A net $n_i$ is fetched from SS. The CPU 1200 checks whether $n_i \in SS_A$. In response to determining that $n_i \in SS_A$ then type A operation is applied to it. When $n_i \in SS_B$, then the CPU 1200 fetches another net $n_j \in SS_B$ from SS and Type B operation is applied to the nets $n_i$ and $n_j$.

Figure 9:
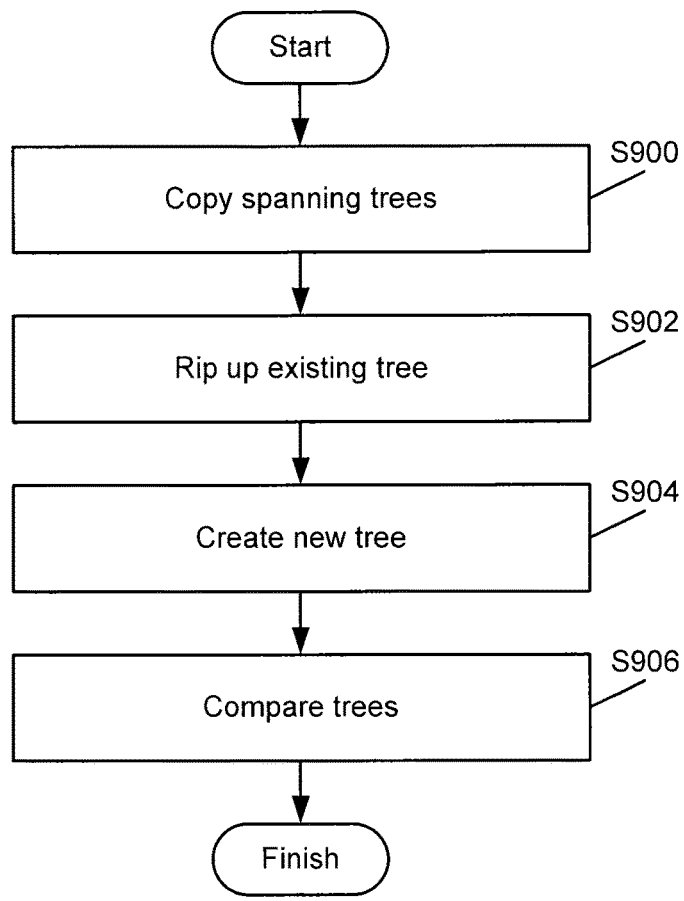
FIG. 9 is a flow chart that shows an R&R operation according to one example.

FIG. 9 is a flow chart that shows an R&R operation according to one example. The flowchart shows the main steps in both types of R&R operations. At step S900, the CPU 1200 copies the spanning tree(s) of the selected nets into temporary variables. At step S902, the CPU 1200 deletes (rip-up) the existing spanning tree. At step S904, the CPU 1200 creates a new tree using MRF method. At step S906, the CPU 1200 compares the new tree with the existing ones (the trees stored in temporary variables at step S900) and keeps the better one(s). The comparison is required to ensure that the R&R process is moving towards congestion elimination with limited amount of hill-climbing.

FIG. 10 is an outline of a function for comparing two trees according to one example. FIG. 10 shows the function that compares two spanning trees $t_i$ and $t_i^*$ of a net $n_i$, where $t_i^*$ is the new spanning tree and $t_i$ is the original spanning tree. The function returns true, when $t_i^*$ is better than $t_i$. In the comparison function, if the inferior solution are always rejected then there is a high chance that the R&R process described herein can get stuck into a local optima because of no hill-climbing. Therefore, the R&R operation occasionally allows acceptance of inferior solutions whose difference in the tof value with the original solution is not more than –NEG, where NEG is a fourth parameter which can be set by the user 104 and stored in the memory 1202.

The global router described herein has two types of parameters: static parameters and self-adjustable (adaptable) parameters. The values of static parameters are set by the user 104 and remains constant through out the execution. The values of self-adjustable parameters change following an arithmetic progression (APs) in the parameter values update 312. The AP of any parameter can be completely specified by three terms: (first term, last term, and difference). The first term in its initial value, the last term is its maximum value and the difference is the amount by which its increments during self-adjustment. The user 104 may specify the three terms of AP for each self-adjustable parameter. During the execution of the global router, the parameter values update module 312 updates the parameter value using their APs. In most of self-adjusting parameters, when their value becomes equal to the last term of their AP, then their next value is the first term of their AP.

Table 1 shows all the parameters of the global router described herein and classifies them as static or self-adjustable. The parameter Tm represents a threshold value for tof value of the current iteration such that if its value becomes smaller than Tm, then the value of the second parameter BOX_SIZE is set equal to its last term. A fifth parameter CT2 represents the number of preceding iterations whose tof values are used in adjusting the parameters values.

TABLE 1

| List of all parameters | | |
|---|---|---|
| Parameters | Type | AP representation |
| RR1 | Self-adjustable | RR1 ($RR1_i$, $RRf$, $RR_d$) |
| CT1 | Self-adjustable | CT1($CT1_i$, $CT1f$, $CT1_d$) |
| TP1 | One-time self-adjustable | — |
| β | Self-adjustable | β($β_i$, $β_f$, $β_d$) |
| BOX_SIZE | Self-adjustable | BOX_SIZE($BOX\_SIZE_i$, $BOX\text{-}SIZE_f$, $BOX\text{-}SIZE_d$) |
| CT2 | Static | — |
| NEG | Static | — |
| $T_m$ | Static | — |

FIG. 11 is an outline of an algorithm for updating the parameter values according to one example. The algorithm is applied, at step S700, at each iteration of the R&R process in the parameter values update module 312 or the CPU 1200. The inputs are: current iteration count and total overflow values of the current iteration and that of last CT2 iterations. In the first iteration (i=0), the values of parameters are initialized and later on, the values of the parameters are adjusted based on overflow value of its preceding iterations. In the first iteration, the value of TP1 is assigned to zero, however, it changes to one based on the conditions mentioned in FIG. 11. The benefit of self-adjusting parameters is that they can help in exploring unique spanning trees for the nets. The global router described herein employs MRF method of routing, and if a same method is applied to a net multiple times with same parameters values then there is a high probability that it return a same solution every time. However, the chances of getting a different spanning tree for a net increases significantly by using different parameter values.

Next, a hardware description of the computer 100 according to exemplary embodiments is described with reference to FIG. 12. In FIG. 12, the computer 100 includes a CPU 1200 which performs the processes described above/below. The process data and instructions may be stored in memory 1202. These processes and instructions may also be stored on a storage medium disk 1204 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computer 100 communicates, such as a server or computer.

Further, the claimed advancements may be provided as a utility application, background daemon, or component of an operating system, or combination thereof, executing in conjunction with CPU 1200 and an operating system such as Microsoft Windows 7, UNIX, Solaris, LINUX, Apple MAC-OS and other systems known to those skilled in the art.

In order to achieve the computer 100, the hardware elements may be realized by various circuitry elements, known to those skilled in the art. For example, CPU 1200 may be a Xenon or Core processor from Intel of America or an Opteron processor from AMD of America, or may be other processor types that would be recognized by one of ordinary skill in the art. Alternatively, the CPU 1200 may be implemented on an FPGA, ASIC, PLD or using discrete logic circuits, as one of ordinary skill in the art would recognize. Further, CPU 1200 may be implemented as multiple processors cooperatively working in parallel to perform the instructions of the inventive processes described above.

The computer 100 further includes a display controller 1208, such as a NVIDIA GeForce GTX or Quadro graphics adaptor from NVIDIA Corporation of America for interfacing with display 1210, such as a Hewlett Packard HPL2445w LCD monitor. A general purpose I/O interface 1212 interfaces with a keyboard and/or mouse 1214 as well as a touch screen panel 1216 on or separate from display 1210. General purpose I/O interface also connects to a variety of peripherals 1218 including printers and scanners, such as an OfficeJet or DeskJet from Hewlett Packard.

The general purpose storage controller 1224 connects the storage medium disk 1204 with communication bus 1226, which may be an ISA, EISA, VESA, PCI, or similar, for interconnecting all of the components of the computer 100.

A description of the general features and functionality of the display 1210, keyboard and/or mouse 1214, as well as the display controller 1208, storage controller 1224 and general purpose I/O interface 1212 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in the circuitry on a single chipset, as shown on FIG. 13.

Figure 13:
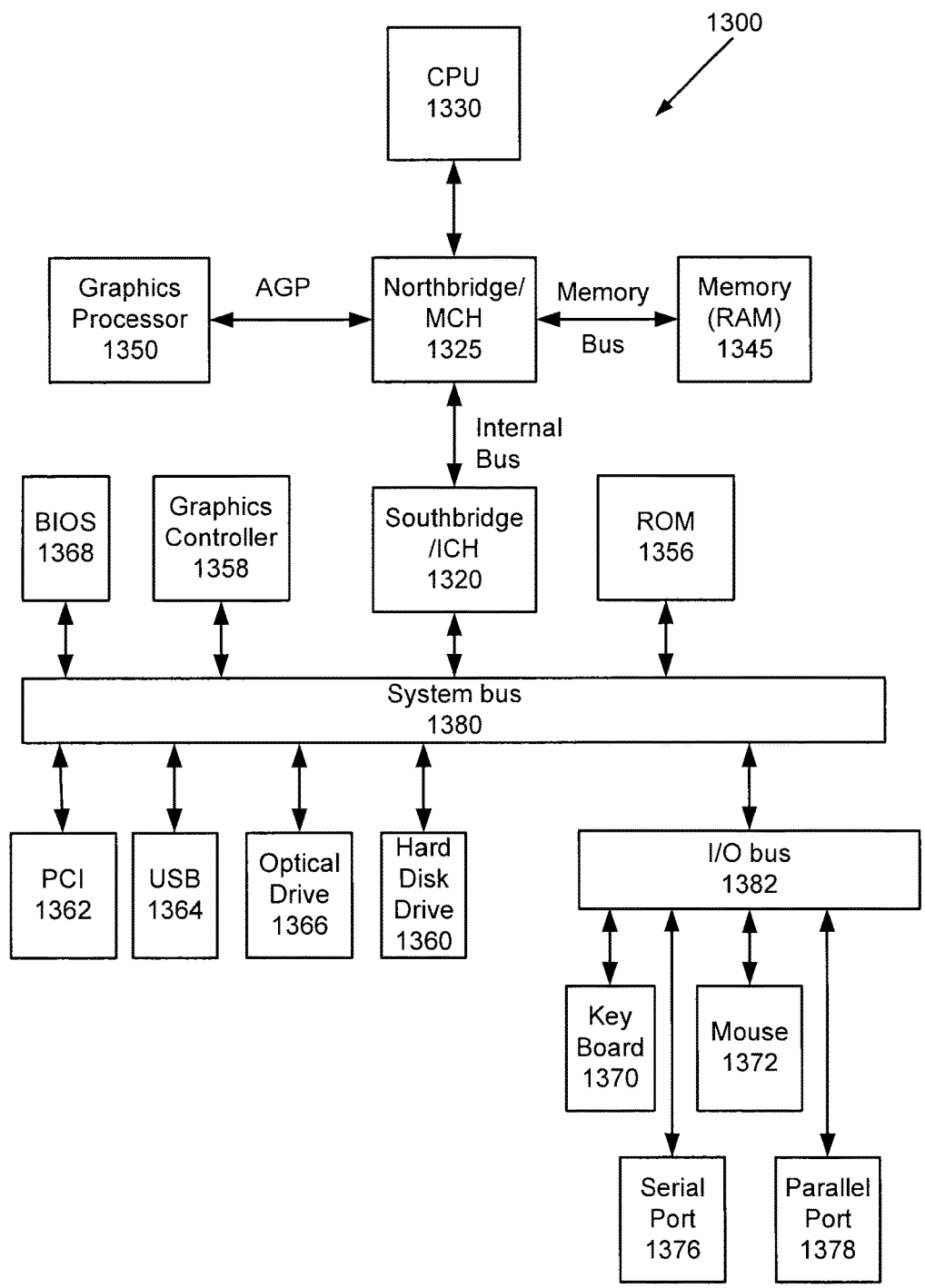
FIG. 13 is an exemplary block diagram of a data processing system according to one example.

FIG. 13 shows a schematic diagram of a data processing system, according to certain embodiments, for performing global routing. The data processing system is an example of a computer in which specific code or instructions implementing the processes of the illustrative embodiments may be located to create a particular machine for implementing the above-noted process.

Figure 14:
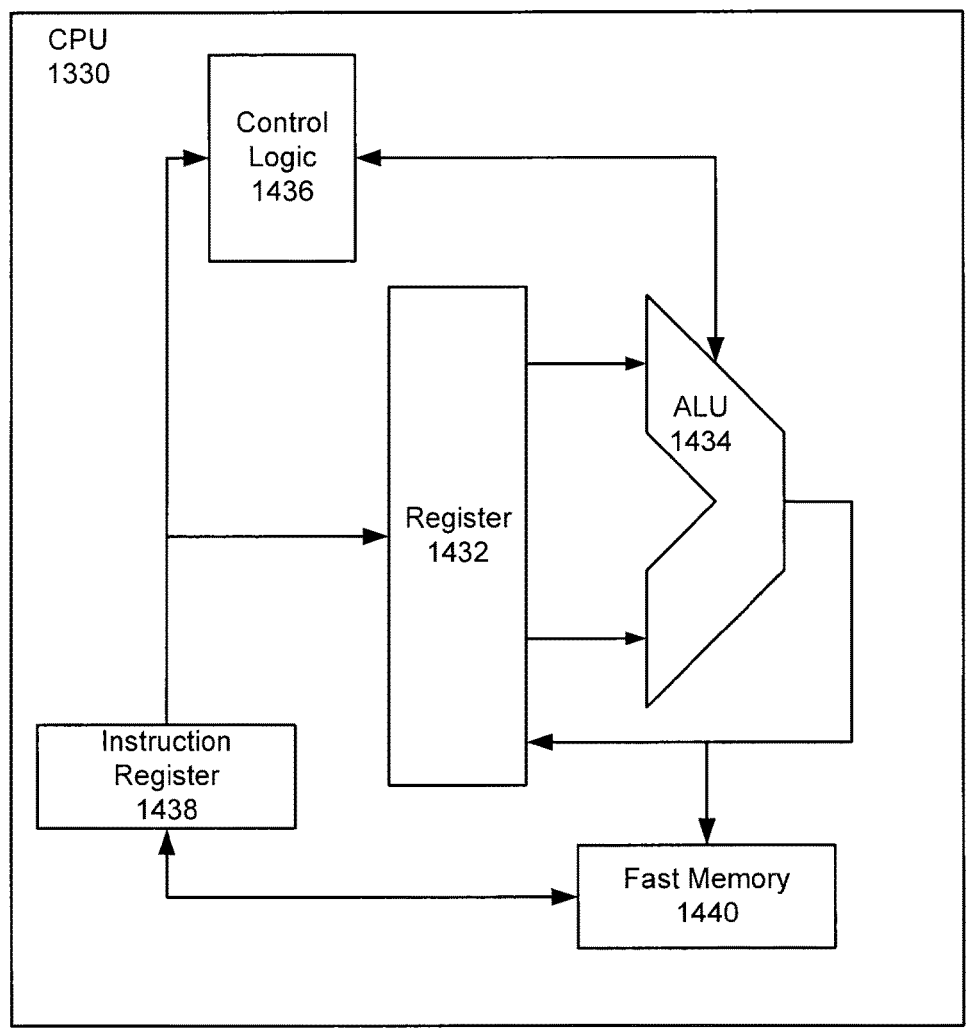
FIG. 14 is an exemplary block diagram of a central processing unit according to one example.

In FIG. 13, data processing system 1300 employs a hub architecture including a north bridge and memory controller hub (NB/MCH) 1325 and a south bridge and input/output (I/O) controller hub (SB/ICH) 1320. The central processing unit (CPU) 1330 is connected to NB/MCH 1325. The NB/MCH 1325 also connects to the memory 1345 via a memory bus, and connects to the graphics processor 1350 via an accelerated graphics port (AGP). The NB/MCH 1325 also connects to the SB/ICH 1320 via an internal bus (e.g., a unified media interface or a direct media interface). The CPU Processing unit 1330 may contain one or more processors and may even be implemented using one or more heterogeneous processor systems. For example, FIG. 14 shows one implementation of CPU 1330.

Further, in the data processing system 1300 of FIG. 13, SB/ICH 1320 is coupled through a system bus 1380 to an I/O Bus 1382, a read only memory (ROM) 1356, an universal serial bus (USB) port 1364, a flash binary input/output system (BIOS) 1368, and a graphics controller 1358. In one implementation, the I/O bus can include a super I/O (SIO) device.

PCI/PCIe devices can also be coupled to SB/ICH 1320 through a PCI bus 1362. The PCI devices may include, for example, Ethernet adapters, add-in cards, and PC cards for notebook computers. Further, the hard disk drive (HDD) 1360 and optical drive 1366 can also be coupled to the SB/ICH 1320 through a system bus. The Hard disk drive 1360 and the optical drive or CD-ROM 1366 can use, for example, an integrated drive electronics (IDE) or serial advanced technology attachment (SATA) interface.

In one implementation, a keyboard 1370, a mouse 1372, a serial port 1376, and a parallel port 1378 can be connected to the system bus 1380 through the I/O bus 1382. Other peripherals and devices that can be connected to the SB/ICH 1320 include a mass storage controller such as SATA or PATA (Parallel Advanced Technology Attachment), an Ethernet port, an ISA bus, a LPC bridge, SMBus, a DMA controller, and an Audio Codec (not shown).

In one implementation of CPU 1330, the instruction register 1438 retrieves instructions from the fast memory 1440. At least part of these instructions are fetched from the instruction register 1438 by the control logic 1436 and interpreted according to the instruction set architecture of the CPU 1330. Part of the instructions can also be directed to the register 1432. In one implementation, the instructions are decoded according to a hardwired method, and in another implementation, the instructions are decoded according a microprogram that translates instructions into sets of CPU configuration signals that are applied sequentially over multiple clock pulses. After fetching and decoding the instructions, the instructions are executed using the arithmetic logic unit (ALU) 1434 that loads values from the register 1432 and performs logical and mathematical operations on the loaded values according to the instructions. The results from these operations can be feedback into the register and/or stored in the fast memory 1440. According to certain implementations, the instruction set architecture of the CPU 1330 can use a reduced instruction set architecture, a complex instruction set architecture, a vector processor architecture, a very large instruction word architecture. Furthermore, the CPU 1330 can be based on the Von Neuman model or the Harvard model. The CPU 1330 can be a digital signal processor, an FPGA, an ASIC, a PLA, a PLD, or a CPLD. Further, the CPU 1330 can be an x86 processor by Intel or by AMD; an ARM processor, a Power architecture processor by, e.g., IBM; a SPARC architecture processor by Sun Microsystems or by Oracle; or other known CPU architecture.

The present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

The functions and features described herein may also be executed by various distributed components of a system. For example, one or more processors may execute these system functions, wherein the processors are distributed across multiple components communicating in a network. The distributed components may include one or more client and server machines, which may share processing in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

The hardware description above, exemplified by any one of the structure examples shown in FIG. 12, 13, or 14, constitutes or includes specialized corresponding structure that is programmed or configured to perform the algorithms shown in FIGS. 4, 6, 7, 8, 9, 10 and 11. For example, the algorithm shown in FIG. 4 may be completely performed by the circuitry included in the single device shown in FIG. 12 or the chipset as shown in FIG. 13, or the algorithm may be completely performed in a shared manner.

A system which includes the features in the foregoing description provides numerous advantages to users. In particular, the present disclosure provides an improvement to the technical field by finding a routing solution while minimizing computation. Thus, the present disclosure improves the functioning of a router by increasing processing speed, decreasing power consumption and resulting in a chip area reduction.

Obviously, numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A method for global routing, the method comprising:
   receiving nets that need to be routed and capacity constraints of global routing cells;
   ordering, using processing circuitry, the nets as a function of an area bounded by pins of each net;
   routing, using the processing circuitry, the ordered nets by applying maze routing within a frame having a size as a function of the pins of a net and a first predetermined parameter;
   determining, using the processing circuitry, whether the routing is congestion free based on the capacity constraints of the global routing cells;
   selecting, using the processing circuitry, a subset of the nets based on a game theory method based on a probability of attempting to improve the spanning tree of the net when the routing is not congestion free, the probability being calculated as a function of a plurality of factors;
   applying, using the processing circuitry, a rip-up and re-route process on the subset of the nets;
   repeating the selecting and applying steps until the routing is congestion free; and
   implementing, using processing circuitry, a circuit based on the routing.

2. The method of claim 1, wherein the determining step comprises calculating a total overflow based on the overflow of all edges.

3. The method of claim 1, wherein the rip-up and re-route process is iteratively applied to the subset of nets.

4. The method of claim 3, wherein the rip-up and re-route process rip-up and re-route one or two nets at each iteration.

5. The method of claim 3, further comprising:
   copying an existing spanning tree of the net to a temporary variable;
   deleting the existing spanning tree;
   creating a second spanning tree by applying maze routing within the frame, the frame having a size as a function of the pins of the net and the first predetermined parameter;
   comparing the existing spanning tree stored in the temporary variable with the second spanning tree as a function of the overflow of the existing spanning tree stored in the temporary variable, the second spanning tree, the number of edges having a demand equal to the capacity in the existing spanning tree and the second spanning tree, and a third predetermined parameter;
   storing, in a memory, the second spanning tree or the temporary variable based on the comparison; and
   interleaving the copying, deleting, creating, comparing, and storing steps between the two nets when the rip-up and re-route process is for two nets.

6. The method of claim 1, wherein the routing step further comprises determining a cost based on an edge capacity, an edge demand, and a cost of a preceding cell.

7. The method of claim 6, wherein determining the cost includes applying $$\text{cost}(v_j) = 1 + e^{u_{ij} - (c_{ij} - \beta)} + \text{cost}(v_i)$$

where $v_j$ is a cell with a preceding cell $v_i$, $u_{ij}$ is the demand of an edge $e_{ij}$, $c_{ij}$ is a capacity of the edge $e_{ij}$ wherein the edge $e_{ij}$ represents the edge between $v_j$ and $v_i$, and $\beta$ is a predetermined parameter.

8. The method of claim 1, wherein the probability is a function of the area enclosed by the pins of the net when the value of a second predetermined parameter is zero and the overflow of the net is greater than zero.

9. The method of claim 1, wherein the probability is a function of an overflow of the net, the number of edges whose demand is equal to capacity in the spanning tree of the net, the number of iterations since the net was ripped-up and re-routed, and the number of pins of the net when the value of a second predetermined parameter is equal to one.

10. A system for global routing, the system comprising:
processing circuitry configured to
   receive nets that need to be routed and capacity constraints of global routing cells,
   order the nets as a function of an area bounded by pins of each net,
   route the ordered nets by applying maze routing within a frame having a size as a function of the pins of a net and a first predetermined parameter,
   determine whether the routing is congestion free based on the capacity constraints of the global routing cells,
   select a subset of the nets based on a game theory method based on a probability of attempting to improve the spanning tree of a net when the routing is not congestion free, the probability being calculated as a function of a plurality of factors,
   apply a rip-up and re-route process on the subset of the nets, and
   repeat the selecting and applying steps until the routing is congestion free, and
   implement a circuit based on the routing.

11. The system of claim 10, wherein the processing circuitry is further configured to calculate a total overflow based on the overflow of all edges.

12. The system of claim 10, wherein the rip-up and re-route process is iteratively applied to the subset of nets.

13. The system of claim 12, wherein the rip-up and re-route process rip-up and re-route one or two nets at each iteration.

14. The system of claim 13, wherein the processing circuitry is further configured to:
   copy an existing spanning tree of the net to a temporary variable;
   delete the existing spanning tree;
   create a second spanning tree by applying maze routing within the frame, the frame having a size as a function of the pins of the net and the first predetermined parameter;
   compare the existing spanning tree stored in the temporary variable with the second spanning tree as a function of the overflow of the existing spanning tree stored in the temporary variable, the second spanning tree, the number of edges having a demand equal to the capacity in the existing spanning tree and the second spanning tree, and a third predetermined parameter;
   store, in a memory, the second spanning tree or the temporary variable based on the comparison; and
   interleave the copying, deleting, creating, comparing, and storing steps between the two nets when the rip-up and re-route process is for two nets.

15. The system of claim 10, wherein the probability is a function of the area enclosed by the pins of the net when the value of a second predetermined parameter is zero and the overflow of the net is greater than zero.

16. The system of claim 10, wherein the probability is a function of an overflow of the net, the number of edges whose demand is equal to capacity in the spanning tree of the net, the number of iterations since the net was ripped-up and re-routed, and the number of pins of the net when the value of a second predetermined parameter is equal to one.

* * * * *